(12) United States Patent
Agan et al.

(10) Patent No.: US 7,397,277 B2
(45) Date of Patent: Jul. 8, 2008

(54) MAGNETIC TRANSISTOR CIRCUIT WITH THE EXOR FUNCTION

(75) Inventors: Tom Allen Agan, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 7 days.

(21) Appl. No.: 11/549,257

(22) Filed: Oct. 13, 2006

(65) Prior Publication Data

US 2007/0103196 A1 May 10, 2007

Related U.S. Application Data

(60) Provisional application No. 60/727,349, filed on Oct. 17, 2005.

(51) Int. Cl.
*G06F 7/50* (2006.01)
*H03K 19/21* (2006.01)

(52) U.S. Cl. ........................................................ 326/52

(58) Field of Classification Search ............. 326/52–55, 326/104–136; 257/295, 421; 365/171
See application file for complete search history.

(56) References Cited

U.S. PATENT DOCUMENTS

| 5,629,549 | A | * | 5/1997 | Johnson | 257/421 |
| 5,654,566 | A | * | 8/1997 | Johnson | 257/295 |
| 6,249,453 | B1 | * | 6/2001 | You et al. | 365/171 |
| 6,288,565 | B1 | * | 9/2001 | Johnson | 326/37 |

* cited by examiner

*Primary Examiner*—Rexford Barnie
*Assistant Examiner*—Crystal L Hammond
(74) *Attorney, Agent, or Firm*—Thomas, Kayden, Horstemeyer & Risley

(57) ABSTRACT

A magnetic transistor circuit has a first and a second magnetic transistor. These two magnetic transistors that work as the ordinary transistors can be turned on or turned off by the control of several metal devices respectively disposed around the magnetic transistors. The EXOR logic function of the binary system can be implemented by the control of these metal devices.

16 Claims, 5 Drawing Sheets

MAGNETIC TRANSISTOR CIRCUIT WITH THE EXOR FUNCTION

CROSS-REFERENCE TO RELATED APPLICATION

This application claims the priority benefit of provisional application Ser. No. 60/727,349, filed on Oct. 17, 2005, the full disclosure of which is incorporated herein by reference.

BACKGROUND

1. Field of Invention

The present invention relates to a transistor circuit with the EXOR function. More particularly, the present invention relates to a transistor circuit with the EXOR function configured by several magnetic transistors.

2. Description of Related Art

The EXOR circuit is very important for IC circuit design. The designer can combine this circuit with other logic circuits to implement the required functions.

The EXOR logic function is:

output=$X \cdot Y' + X' \cdot Y$

The truth table of the OR logic function of the binary system according to the embodiment of this invention is:

| output | Y = 1 | Y = 0 |
|---|---|---|
| X = 1 | 0 | 1 |
| X = 0 | 1 | 0 |

The traditional transistor circuit with the EXOR function of the table above needs a large number of CMOS transistors.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic transistor circuit without the expensive process and equipment. The magnetic transistor circuit can be designed and manufactured with short programming time and high density.

For the foregoing reasons, there is a need to have a magnetic transistor circuit with the EXOR function integrated by magnetic transistors.

SUMMARY

It is therefore an aspect of the present invention to provide a transistor circuit device with the EXOR function implemented by magnetic transistors.

According to one embodiment of the present invention, the magnetic transistor circuit has a first and a second magnetic transistor. The first magnetic transistor has a first magnetic section and a second magnetic section, wherein the first magnetic section couples to a high voltage end, and the second magnetic section couples to an output end. The second magnetic transistor has a third magnetic section and a fourth magnetic section, wherein the third magnetic section couples to a low voltage end, and the fourth magnetic section couples to the second magnetic section and the output end. The second and the fourth magnetic section have same dipole, and the first and the third magnetic section have opposite dipoles; the dipoles of the first, second, third and fourth magnetic sections are arranged to control the data outputted at the output end.

According to another embodiment of the present invention, the method uses a magnetic transistor circuit to generate the EXOR function. The method comprises using a first magnetic transistor having a first magnetic section and a second magnetic section, wherein the first magnetic section couples to a high voltage end, and the second magnetic section couples to an output end; and using a second magnetic transistor having a third magnetic section and a fourth magnetic section, wherein the third magnetic section couples to a low voltage end, and the fourth magnetic section couples to the second magnetic section and the output end. The method uses the dipoles of the first, second, third and fourth magnetic sections respectively to control the data outputted at the output end, wherein the second and the fourth magnetic section have same dipole, and the first and the third magnetic section have opposite dipoles.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
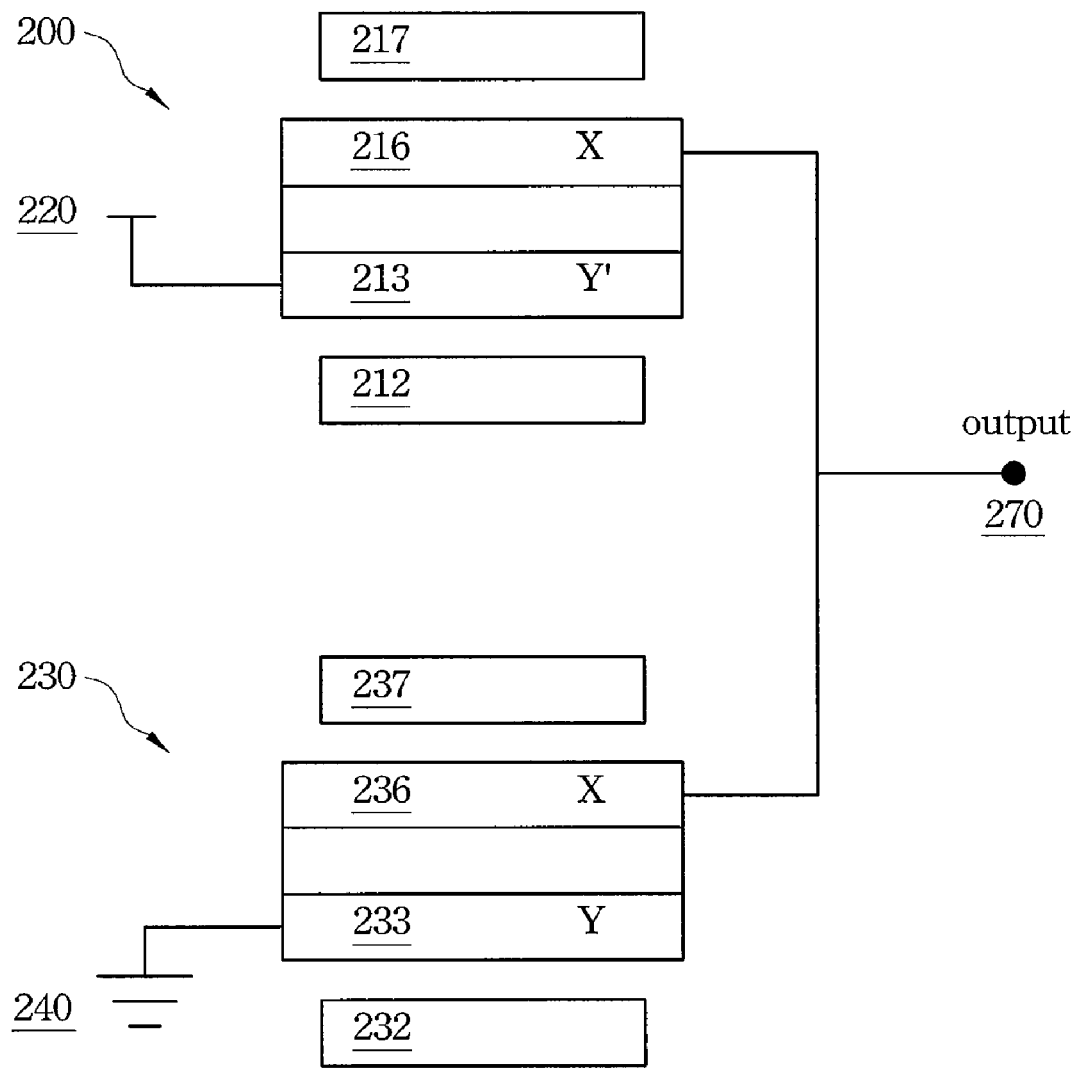
FIG. 1 is the magnetic transistor circuit with the EXOR function according to the embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

FIG. 1 is the magnetic transistor circuit with the EXOR function according to the embodiment of this invention. The magnetic transistor circuit has a first magnetic transistor 200 and a second magnetic transistor 230. The first magnetic transistor 200 has a first magnetic section 213 and a second magnetic section 216, wherein the first magnetic section 213 couples to a high voltage end 220, and the second magnetic section 216 couples to an output end 270. The second magnetic transistor 230 has a third magnetic section 233 and a fourth magnetic section 236, wherein the third magnetic section 233 couples to a low voltage end 240, and the fourth magnetic section 236 couples to the second magnetic section 216 and the output end 270. The second and the fourth magnetic section 216 and 236 have same dipole, and the first and the third magnetic section 213 and 233 have opposite dipoles; the dipoles of the first, second, third and fourth magnetic sections 213, 216, 233 and 236 are arranged to control the data outputted at the output end 270.

The magnetic transistor circuit further comprises a plurality of metal devices 212, 217, 232 and 237 respectively disposed around the magnetic sections 213, 216, 233 and 236. The metal devices 212, 217, 232 and 237 are arranged to respectively control dipoles of the magnetic sections 213, 216, 233 and 236. For example, the first magnetic transistor 200 has metal devices 212 and 217 respectively disposed around the magnetic sections 213 and 216. The metal device 212 is arranged to control the dipole of the magnetic section 213, and the metal device 217 is arranged to control the dipole of the magnetic section 216.

By the description above, the designer can use the metal devices to control the dipoles of the magnetic sections. The designer can further use the dipoles of these two magnetic sections of one magnetic transistor to control the conductivity between these two magnetic sections.

For example, when dipoles of the first magnetic section 213 and the second magnetic section 216 are the same, the first magnetic section 213 and the second magnetic section 216 are conductive, when dipoles of the first magnetic section 213 and the second magnetic section 216 are different, the first magnetic section 213 and the second magnetic section 216 are not conductive.

When dipoles of the third magnetic section 233 and the fourth magnetic section 236 are the same, the third magnetic section 233 and the fourth magnetic section 236 are conductive, when dipoles of the third magnetic section 233 and the fourth magnetic section 236 are different, the third magnetic section 233 and the fourth magnetic section 236 are not conductive.

By the description above, characteristics of the magnetic transistor can be used to implement a circuit with some logic functions.

The magnetic transistor circuit of FIG. 1 has EXOR logic function of the binary system as describe bellow.

The EXOR logic function is:

output=$X \cdot Y' + X' \cdot Y$

The truth table of the EXOR logic function of the binary system according to the embodiment of this invention is:

| output | Dipole Y = 1(→) | Dipole Y = 0(←) |
|---|---|---|
| Dipole X = 1(→) | 0 | 1 |
| Dipole X = 0(←) | 1 | 0 |

Wherein 'output' is the data outputted at the output end 270, 'X' is dipoles of the magnetic sections 216 and 236, 'Y' is the dipole of the magnetic section 233. The first and the third magnetic section 213 and 233 have opposite dipoles, therefore the dipole of the first magnetic section 213 is Y' (i.e. not Y). The symbols '→' and '←' are arranged to respectively represent the first dipole and the second dipole. How to use dipoles of X and Y to create the EXOR logic function is described as bellow.

Figure 2A:
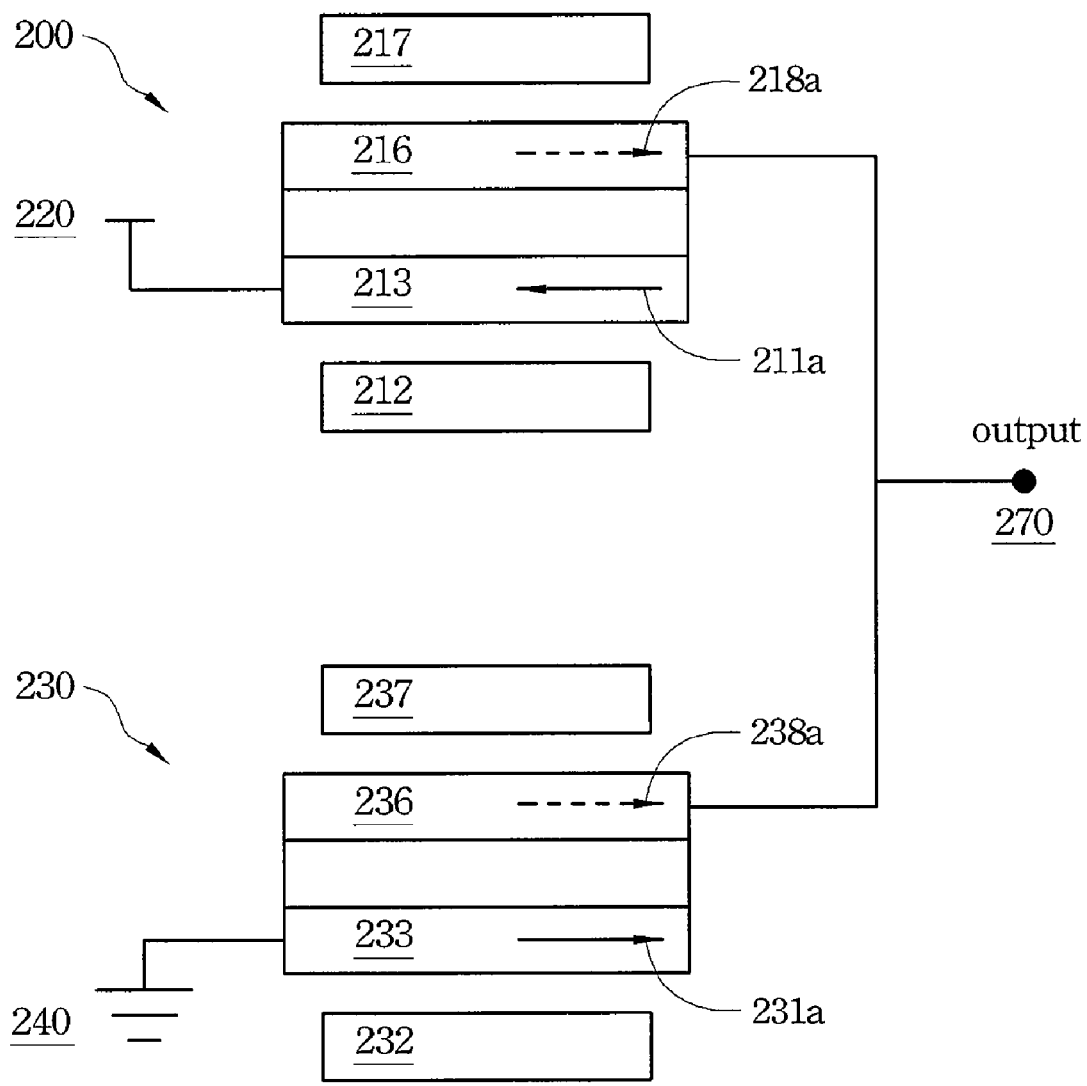
FIG. 2A is the magnetic transistor circuit operating an EXOR function of the binary system according to the embodiment of this invention.

FIG. 2A is the magnetic transistor circuit operating an EXOR function of the binary system according to the embodiment of this invention. Wherein when the magnetic transistor circuit operates the EXOR function to output data '0' of the binary system, dipoles 218*a* and 238*a* of the second and fourth magnetic sections 216 and 236 are a first dipole that represents data '1' of the binary system to control the output data, and dipoles 211*a* and 231*a* of the first and third magnetic sections 213 and 233 are a second dipole and the first dipole respectively represents data '0' and '1' of the binary system to control the output data.

Figure 2B:
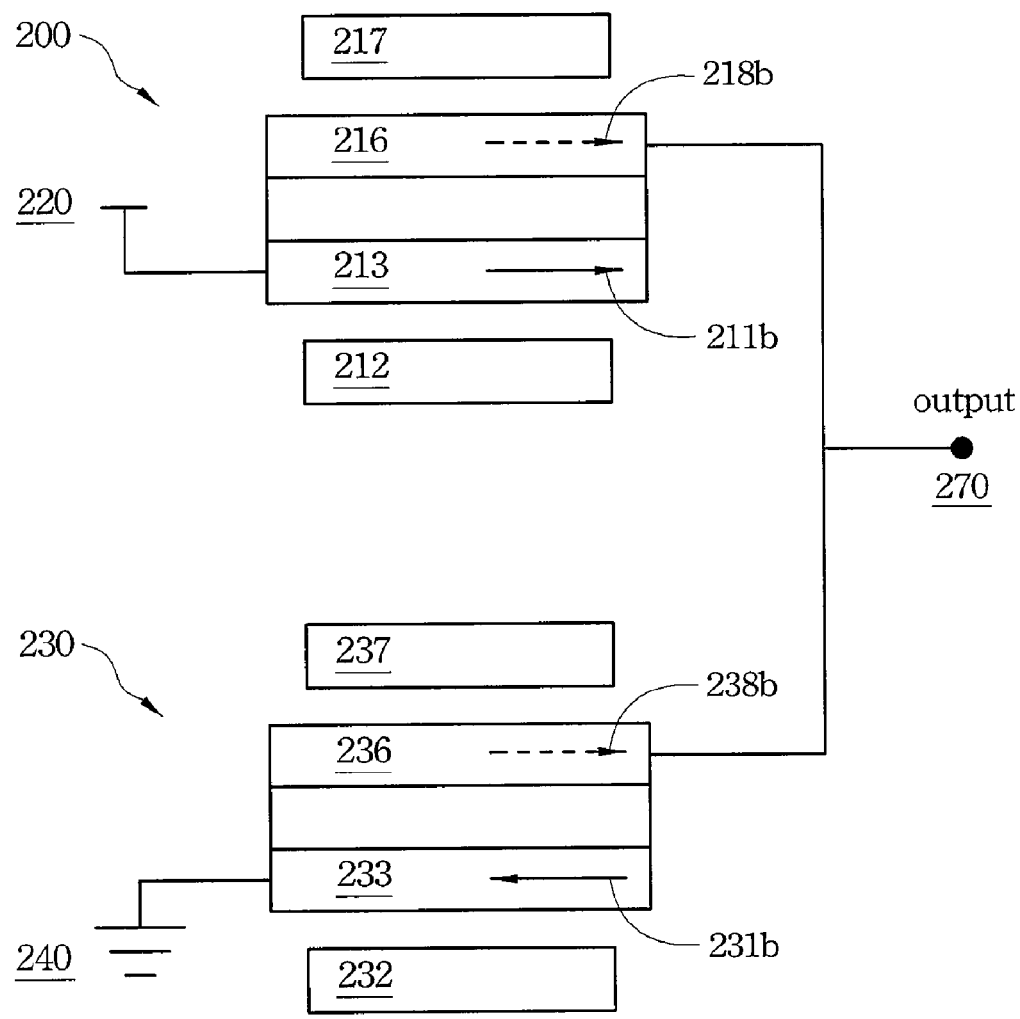
FIG. 2B is the magnetic transistor circuit operating another EXOR function of the binary system according to the embodiment of this invention.

FIG. 2B is the magnetic transistor circuit operating another EXOR function of the binary system according to the embodiment of this invention. Wherein when the magnetic transistor circuit operates the EXOR function to output data '1' of the binary system, dipoles 218*b* and 238*b* of the second and fourth magnetic sections 216 and 236 are the first dipole that represents data '1' of the binary system to control the output data, and dipoles 211*b* and 231*b* of the first and third magnetic sections 213 and 233 are the first dipole and the second dipole respectively represents data '1' and '0' of the binary system to control the output data.

Figure 2C:
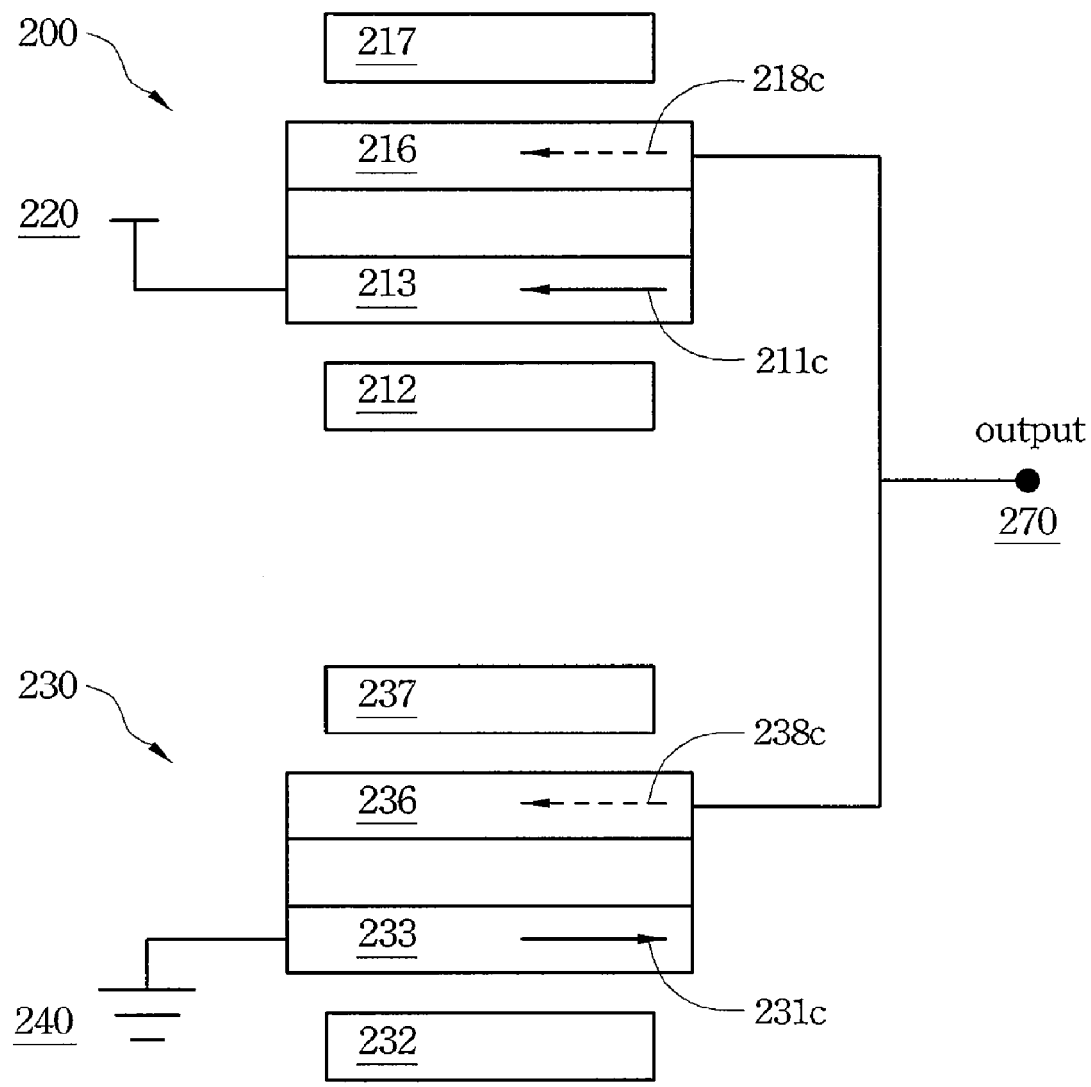
FIG. 2C is the magnetic transistor circuit operating another EXOR function of the binary system according to the embodiment of this invention.

FIG. 2C is the magnetic transistor circuit operating another EXOR function of the binary system according to the embodiment of this invention. When the magnetic transistor circuit operates the EXOR function to output data '1' of the binary system, dipoles 218*c* and 238*c* of the second and fourth magnetic sections 216 and 236 are the second dipole that represents data '0' of the binary system to control the output data, and dipoles 211*c* and 231*c* of the first and third magnetic sections 213 and 233 are the second dipole and the first dipole respectively represents data '0' and '1' of the binary system to control the output data.

Figure 2D:
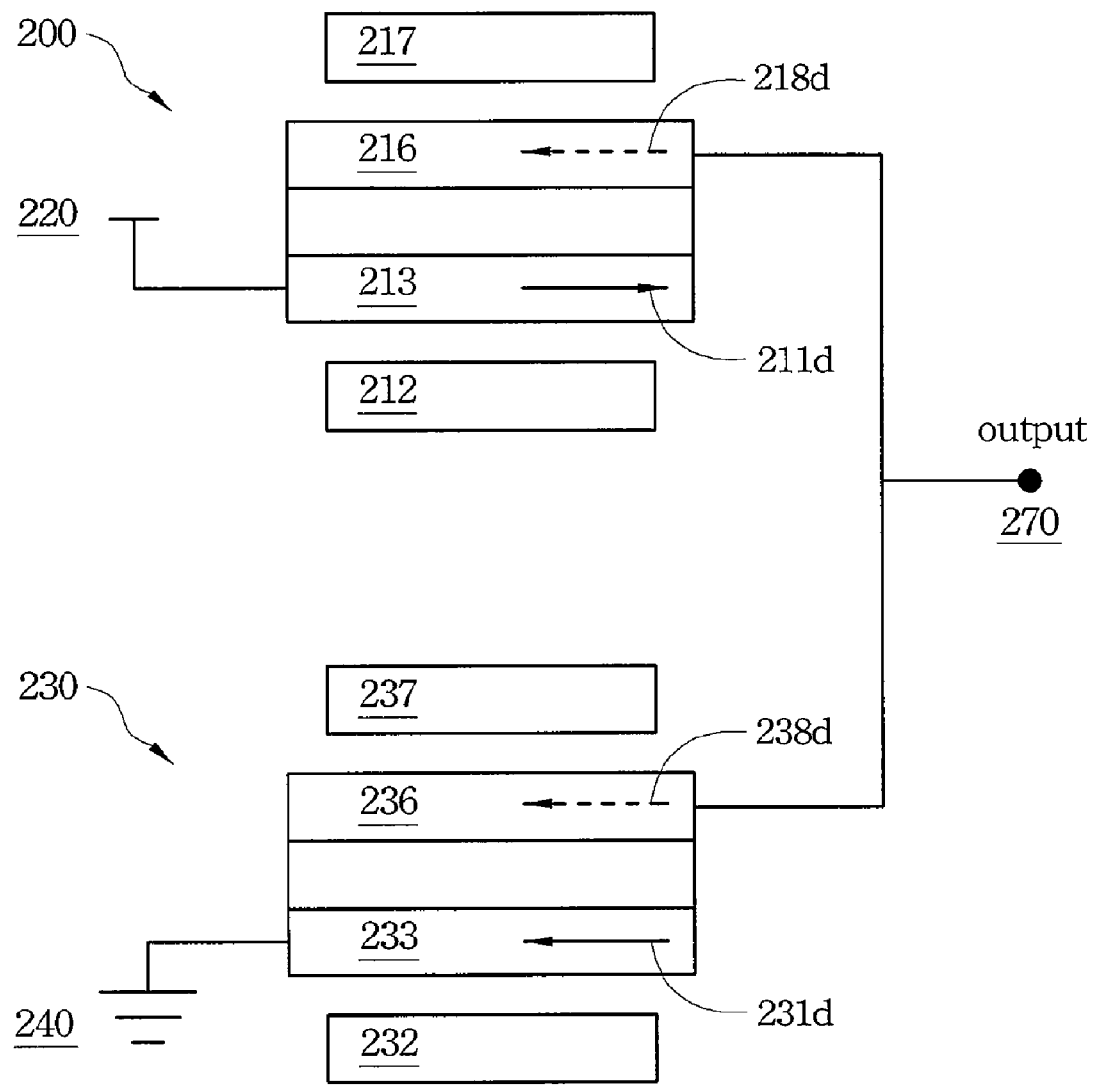
FIG. 2D is the magnetic transistor circuit operating another EXOR function of the binary system according to the embodiment of this invention.

FIG. 2D is the magnetic transistor circuit operating another EXOR function of the binary system according to the embodiment of this invention. Wherein when the magnetic transistor circuit operates the EXOR function to output data '0' of the binary system, dipoles 218*d* and 238*d* of the second and fourth magnetic sections 216 and 236 are the second dipole that represents data '0' of the binary system to control the output data, and dipoles 211*d* and 231*d* of the first and third magnetic sections 213 and 233 are the first dipole and the second dipole respectively represents data '1' and '0' of the binary system to control the output data.

Therefore, the magnetic transistor circuit can operate the EXOR function by this device.

Moreover, The present invention also provided a method using a magnetic transistor circuit to generate the EXOR function. The method comprises using a first magnetic transistor 220 having a first magnetic section 213 and a second magnetic section 216, wherein the first magnetic section 213 couples to a high voltage end 220, and the second magnetic section 216 couples to an output end 270; and using a second magnetic transistor 230 having a third magnetic section 233 and a fourth magnetic section 236, wherein the third magnetic section 233 couples to a low voltage end 240, and the fourth magnetic section 236 couples to the second magnetic section 216 and the output end 270. The method also uses a plurality of dipoles of the first, second, third and fourth magnetic sections respectively to control the data outputted at the output end, wherein the second and the fourth magnetic section have same dipole, and the first and the third magnetic section have opposite dipoles.

When the magnetic transistor circuit operates the EXOR function to output data '0' of the binary system, the method makes dipoles of the second and fourth magnetic sections 216 and 236 the first dipole that represents data '1' of the binary system, and makes dipoles of the first and third magnetic sections a second dipole and the first dipole that respectively represents data '0' and '1' of the binary system. When the magnetic transistor circuit operates the EXOR function to output data '1' of the binary system, the method makes dipoles of the second and fourth magnetic sections 216 and 236 the first dipole that represents data '1' of the binary system, and makes dipoles of the first and third magnetic sections the first dipole and the second dipole that respectively represents data '1' and '0' of the binary system.

When the magnetic transistor circuit operates the EXOR function to output data '1' of the binary system, the method makes dipoles of the second and fourth magnetic sections 216 and 236 the second dipole that represents data '0' of the binary system, and makes dipoles of the first and third magnetic sections the second dipole and the first dipole that respectively represents data '0' and '1' of the binary system. When the magnetic transistor circuit operates the EXOR function to output data '0' of the binary system, the method makes dipoles of the second and fourth magnetic sections 216 and 236 the second dipole that represents data '0' of the binary system, and makes dipoles of the first and third magnetic sections the first dipole and the second dipole that respectively represents data '1' and '0' of the binary system.

In order to corporate with the ordinary integrated circuits of semiconductor, a voltage of the low voltage end 240 is about 0 volt, and a voltage of the high voltage end 220 is about 2.5 volt, 3.3 volt or 5 volt.

The symbols '→' and '←' here are just arranged to respectively represent the dipoles of the magnetic sections, not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic transistor circuit is a two-input circuit with the EXOR function. By the description above, the magnetic transistor circuit and method described above can be used to generate the EXOR function.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic transistor circuit with the EXOR function, comprising:
    a first magnetic transistor having a first magnetic section and a second magnetic section, wherein the first magnetic section couples to a high voltage end, and the second magnetic section couples to an output end; and
    a second magnetic transistor having a third magnetic section and a fourth magnetic section, wherein the third magnetic section couples to a low voltage end, and the fourth magnetic section couples to the second magnetic section and the output end;
    wherein the second and the fourth magnetic section have same dipole, and the first and the third magnetic section have opposite dipoles; the dipoles of the first, second, third and fourth magnetic sections are arranged to control the data outputted at the output end.

2. The magnetic transistor circuit with the EXOR function of claim 1, further comprising a plurality of metal devices respectively disposed around the magnetic sections, wherein the metal devices are arranged to respectively control dipoles of the magnetic sections.

3. The magnetic transistor circuit with the EXOR function of claim 1, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

4. The magnetic transistor circuit with the EXOR function of claim 1, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

5. The magnetic transistor circuit with the EXOR function of claim 1, wherein when the magnetic transistor circuit operates the EXOR function to output data '0' of the binary system, dipoles of the second and fourth magnetic sections are a first dipole that represents data '1' of the binary system, and dipoles of the first and third magnetic sections are a second dipole and the first dipole that respectively represents data '0' and '1' of the binary system to control the output data.

6. The magnetic transistor circuit with the EXOR function of claim 1, wherein when the magnetic transistor circuit operates the EXOR function to output data '1' of the binary system, dipoles of the second and fourth magnetic sections are the first dipole that represents data '1' of the binary system, and dipoles of the first and third magnetic sections are the first dipole and the second dipole that respectively represents data '1' and '0' of the binary system to control the output data.

7. The magnetic transistor circuit with the EXOR function of claim 1, wherein when the magnetic transistor circuit operates the EXOR function to output data '1' of the binary system, dipoles of the second and fourth magnetic sections are the second dipole that represents data '0' of the binary system, and dipoles of the first and third magnetic sections are the second dipole and the first dipole that respectively represents data '0' and '1' of the binary system to control the output data.

8. The magnetic transistor circuit with the EXOR function of claim 1, wherein when the magnetic transistor circuit operates the EXOR function to output data '0' of the binary system, dipoles of the second and fourth magnetic sections are the second dipole that represents data '0' of the binary system, and dipoles of the first and third magnetic sections are the first dipole and the second dipole that respectively represents data '1' and '0' of the binary system to control the output data.

9. A method using a magnetic transistor circuit to generate the EXOR function, comprising:
    using a first magnetic transistor having a first magnetic section and a second magnetic section, wherein the first magnetic section couples to a high voltage end, and the second magnetic section couples to an output end;
    using a second magnetic transistor having a third magnetic section and a fourth magnetic section, wherein the third magnetic section couples to a low voltage end, and the fourth magnetic section couples to the second magnetic section and the output end; and using a plurality of dipoles of the first, second, third and fourth magnetic sections respectively to control the data outputted at the output end, wherein the second and the fourth magnetic section have same dipole, and the first and the third magnetic section have opposite dipoles.

10. The method of claim 9, further comprising using a plurality of metal devices respectively disposed around the magnetic sections, wherein the metal devices are arranged to respectively control dipoles of the magnetic sections.

11. The method of claim 9, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

12. The method of claim 9, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

13. The method of claim 9, wherein when the magnetic transistor circuit operates the EXOR function to output data '0' of the binary system, making dipoles of the second and fourth magnetic sections the first dipole that represents data '1' of the binary system, and making dipoles of the first and third magnetic sections a second dipole and the first dipole that respectively represents data '0' and '1' of the binary system.

14. The method of claim 9, wherein when the magnetic transistor circuit operates the EXOR function to output data '1' of the binary system, making dipoles of the second and fourth magnetic sections the first dipole that represents data '1' of the binary system, and making dipoles of the first and third magnetic sections the first dipole and the second dipole that respectively represents data '1' and '0' of the binary system.

15. The method of claim 9, wherein when the magnetic transistor circuit operates the EXOR function to output data '1' of the binary system, making dipoles of the second and fourth magnetic sections the second dipole that represents data '0' of the binary system, and making dipoles of the first and third magnetic sections the second dipole and the first dipole that respectively represents data '0' and '1' of the binary system.

16. The method of claim 9, wherein when the magnetic transistor circuit operates the EXOR function to output data '0' of the binary system, making dipoles of the second and fourth magnetic sections the second dipole that represents data '0' of the binary system, and making dipoles of the first and third magnetic sections the first dipole and the second dipole that respectively represents data '1' and '0' of the binary system.

* * * * *